(12) United States Patent
Fukuhara et al.

(10) Patent No.: US 7,537,871 B2
(45) Date of Patent: May 26, 2009

(54) METHOD OF MANUFACTURING SEMICONDUCTOR DEVICE

(75) Inventors: Kazuya Fukuhara, Tokyo (JP); Eishi Shiobara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 11/543,208

(22) Filed: Oct. 5, 2006

(65) Prior Publication Data
US 2007/0082295 A1    Apr. 12, 2007

(30) Foreign Application Priority Data
Oct. 7, 2005    (JP)    ............................. 2005-294740

(51) Int. Cl.
*G03C 5/00*    (2006.01)
*G03F 9/00*    (2006.01)
*G01N 21/41*    (2006.01)

(52) U.S. Cl. ............................. 430/30; 430/5; 430/302; 356/128

(58) Field of Classification Search ...................... 430/5, 430/30, 302; 356/128
See application file for complete search history.

(56) References Cited

U.S. PATENT DOCUMENTS

| 6,844,206 | B1 | 1/2005 | Phan et al. |
| 7,006,209 | B2 * | 2/2006 | Levinson ..................... 356/128 |
| 2005/0018208 | A1 | 1/2005 | Levinson |
| 2005/0046813 | A1 | 3/2005 | Streefkerk et al. |
| 2007/0105050 | A1 * | 5/2007 | Jahromi et al. ............... 430/311 |

FOREIGN PATENT DOCUMENTS

JP    6-124873    5/1994

* cited by examiner

*Primary Examiner*—Christopher G Young
(74) *Attorney, Agent, or Firm*—Finnegan, Henderson, Farabow, Garrett & Dunner, L.L.P.

(57) ABSTRACT

A method of manufacturing a semiconductor device using immersion exposure in which exposure is carried out with an immersion exposure liquid interposed between a projection lens and a substrate, includes preparing a photomask on which a plurality of patterns are formed, projecting the patterns formed on the photomask, on a predetermined surface via the projection lens and the immersion exposure liquid, acquiring dimensional information on dimension acquiring patterns based on the patterns projected on the predetermined surface, adjusting a refractive index of the immersion exposure liquid on the basis of the dimensional information, and projecting patterns formed on the photomask, on a substrate via the projection lens and the immersion exposure liquid with the refractive index adjusted.

15 Claims, 3 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-294740, filed Oct. 7, 2005, the entire contents of which are incorporated herein by reference.

BACKGROUND OF THE INVENTION

1. Field of the Invention

The present invention relates to a method of manufacturing a semiconductor device.

2. Description of the Related Art

The reduced size and increased integration level of semiconductor devices have made it more important to accurately form patterns of desired sizes.

However, a reduction in pattern size may result in an optical proximity effect (OPE), which prevents photoresist patterns of desired dimensions from being faithfully formed. For example, an isolated line and a dense line (or isolated line and isolated space) having the same line width on a photomask may have different line widths on photoresist patterns. Thus, for an actual photomask, mask patterns are subjected to an optical proximity correction (OPC) to obtain photoresist patterns of desired dimensions.

However, even a photomask subjected to the optical proximity correction may make the photoresist patterns deviate from the desired dimensions. A possible cause is a temporal change in a factor contributing to the optical proximity effect. Another possible cause is a variation in the factor contributing to the optical proximity effect among exposure apparatuses.

Much effort has been made to develop immersion exposure as a technique for improving the resolution of photolithography. The immersion exposure involves carrying out exposure with a liquid such as water interposed between a projection lens and a substrate (see, for example, Jpn. Pat. Appln. KOKAI Publication No. 6-124873). The immersion exposure may also be involved in the above problem, and an effective solution has been desired.

BRIEF SUMMARY OF THE INVENTION

An aspect of the present invention provides a method of manufacturing a semiconductor device using immersion exposure in which exposure is carried out with an immersion exposure liquid interposed between a projection lens and a substrate, the method comprising: preparing a photomask on which a plurality of patterns are formed; projecting the patterns formed on the photomask, on a predetermined surface via the projection lens and the immersion exposure liquid; acquiring dimensional information on dimension acquiring patterns based on the patterns projected on the predetermined surface; adjusting a refractive index of the immersion exposure liquid on the basis of the dimensional information; and projecting patterns formed on the photomask, on a substrate via the projection lens and the immersion exposure liquid with the refractive index adjusted.

DETAILED DESCRIPTION OF THE INVENTION

Embodiments of the present invention will be described with reference to the drawings.

Embodiment 1

Figure 1:
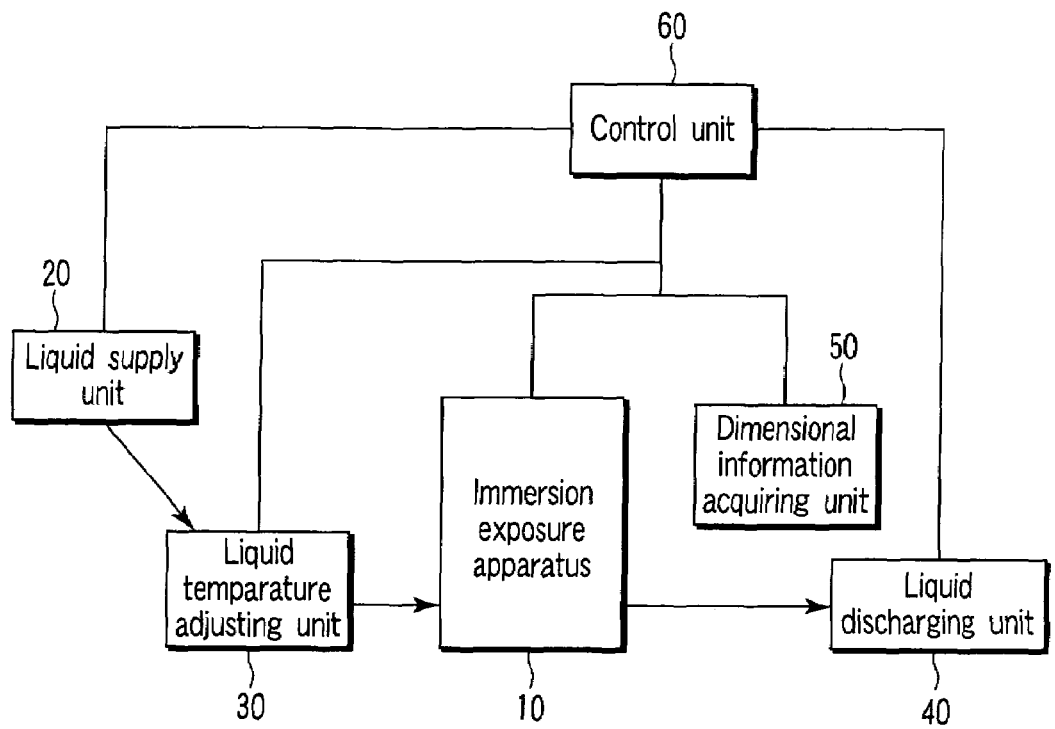
FIG. 1 is a block diagram schematically showing an exposure system according to first to fourth embodiments of the present invention.

FIG. 1 is a block diagram schematically showing an exposure system according to a first embodiment of the present invention.

Figure 2:
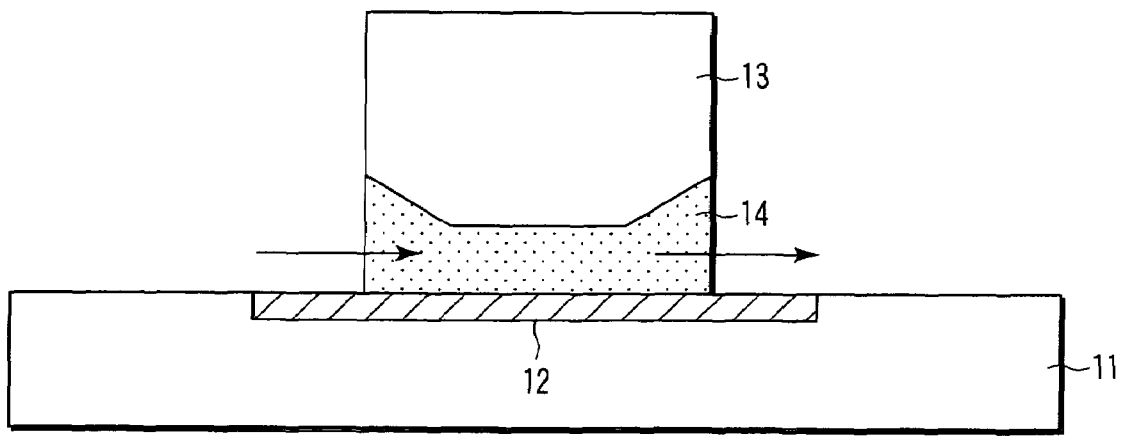
FIG. 2 is a diagram schematically showing a part of configuration of an immersion exposure apparatus according to the first to fourth embodiments of the present invention.

An immersion exposure apparatus 10 carries out exposure with an immersion exposure liquid interposed between a projection lens and a substrate. FIG. 2 is a diagram schematically showing a part of the configuration of the immersion exposure apparatus 10. As shown in FIG. 2, an immersion exposure liquid 14 is interposed between a substrate 12 arranged on a substrate holding stage 11 and a projection lens 13. Mask patterns formed on a photomask (not shown) are projected on the substrate 12 via the projection lens 13 and liquid 14. The substrate 12 is a semiconductor wafer having a photoresist film. The immersion exposure liquid 14 is, for example, water and flows between the substrate 12 and the projection lens 13. The liquid 14 interposed between the substrate 12 and the projection lens 13 has a layer thickness of, for example, about 1 mm.

The immersion exposure apparatus 10 is supplied with an immersion exposure liquid from a liquid supply unit 20 via a liquid temperature adjusting unit 30. The liquid supplied to the immersion exposure apparatus 10 is discharged to a liquid discharging unit 40. The liquid supply unit 20 is able to control the flow velocity of the liquid flowing through the immersion exposure apparatus 10 (flow velocity of the liquid flowing between the substrate 12 and the projection lens 13 as shown in FIG. 2). The liquid temperature adjusting unit 30 is able to control the temperature of the liquid supplied to the immersion exposure apparatus 10.

A dimensional information acquiring unit 50 acquires dimensional information on a plurality of dimension acquiring patterns based on a plurality of patterns projected onto a substrate surface from a photomask. The dimensional information includes differences in dimension between the dimension acquiring patterns. The present embodiment uses photoresist patterns actually formed on a semiconductor wafer by immersion exposure, as the dimension acquiring patterns. The dimensional information acquiring unit 50 includes a scanning electron microscope (SEM) or an optical microscope. The dimensions of the photoresist patterns can be measured by acquiring an image of the photoresist patterns via the scanning electron microscope or optical microscope.

A control unit 60 connects via a LAN (Local Area Network) to the above immersion exposure apparatus 10, liquid supply unit 20, liquid temperature adjusting unit 30, liquid discharging unit 40, and dimensional information acquiring unit 50. The control unit 60 controls the operation of the whole system. The control unit 60 also generates control information required to adjust the refractive index of the immersion exposure liquid, on the basis of dimensional information (differences in dimension between the dimension acquiring patterns) acquired by the dimensional information acquiring unit 50. On the basis of the control information, the refractive index of the immersion exposure liquid is adjusted so as to reduce dimensional differences. In the present embodiment, the control unit 60 sends the control information to the liquid temperature adjusting unit 30, which adjusts the temperature of the immersion exposure liquid. This adjusts the refractive index of the immersion exposure liquid.

The operation of the present embodiment will be described with reference to the flowchart shown in FIG. 3.

Figures 4, 5:
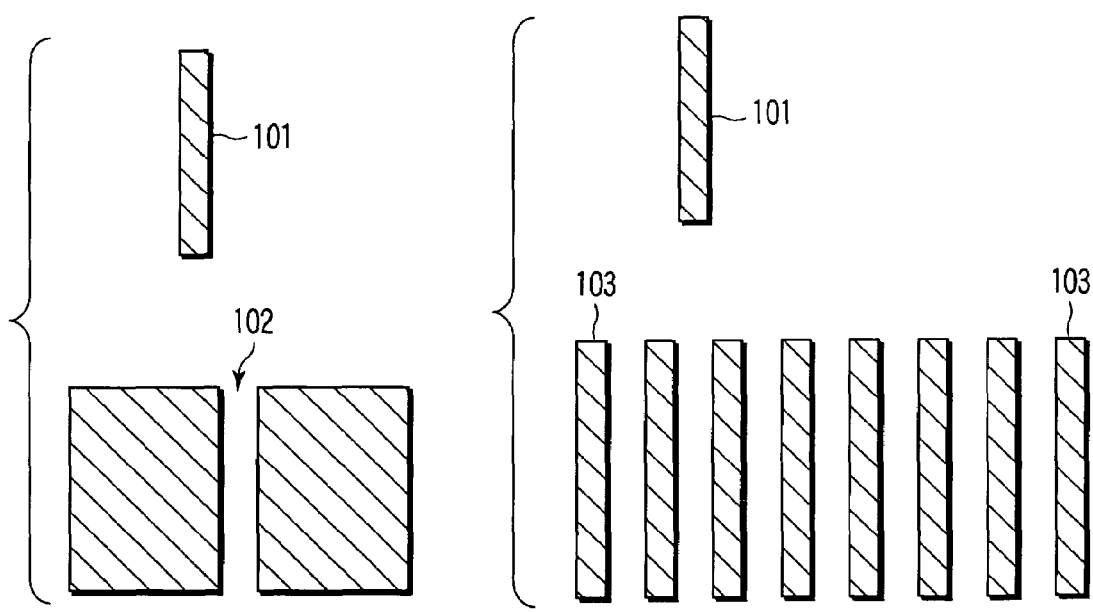
FIG. 4 is a diagram showing an example of patterns formed on a photomask according to the first to fourth embodiments.
FIG. 5 is a diagram showing another example of patterns formed on a photomask according to the first to fourth embodiments.

First, a photomask is prepared on which a plurality of patterns have been formed (S1). FIG. 4 is a diagram showing an example of patterns formed on the photomask. FIG. 5 is a diagram showing another example of patterns formed on the photomask. Actually, patterns of complicated shapes subjected to an optical proximity correction are formed on the photomask. However, the figures show simple patterns for simplification of description. In the example shown in FIG. 4, an isolated line pattern 101 and an isolated space pattern 102 are formed on the same photomask. In the example shown in FIG. 5, the isolated line pattern 101 and dense line patterns 103 are formed on the same photomask. All of the isolated line pattern 101, isolated space pattern 102, and dense line patterns 103 may be formed on the same photomask.

Then, a photomask and a dimension measuring substrate are set on the immersion exposure apparatus 10. Patterns formed on the photomask are projected on a surface (predetermined surface) of the dimension measuring substrate via the projection lens and immersion exposure liquid (S2). This forms a latent image in the photoresist film formed on the surface of the substrate. The photoresist film is further developed to form a photoresist pattern.

Then, the dimensional information acquiring unit 50 acquires the difference in dimension between the isolated line pattern and isolated space pattern, contained in the photoresist pattern (or difference in dimension between the isolated line pattern and dense line pattern) (S3). Ideally, the width of the isolated line pattern is equal to that of the isolated space pattern (or the width of the isolated line pattern is equal to that of the dense line pattern), with the difference in dimension between them being zero. However, temporal changes in various factors (for example, components of the exposure apparatus) contributing to the optical proximity effect may prevent the dimensional difference from being zero. A great dimensional difference prevents the obtainment of patterns that meet predetermined specifications. This may reduce reliability and yield.

The system thus determines whether or not the dimensional difference meets predetermined conditions. Specifically, the system determines whether or not the dimensional difference falls within a predetermined range (S4).

If the dimensional difference is determined not to fall within the predetermined range, the refractive index of the immersion exposure liquid is adjusted so as to reduce the dimensional difference (S5). In the present embodiment, the liquid temperature adjusting unit 30 adjusts the temperature of the immersion exposure liquid so that the dimensional difference falls within the predetermined range. For example, the temperature of the immersion exposure liquid is adjusted using such a method as described below. First, the correlation between the temperature of the immersion exposure liquid and the dimensional difference (or correlation between the amount of change in the temperature of the immersion exposure liquid and the amount of change in dimensional difference) is predetermined. The correlation is stored in the control unit 60. If the dimensional difference does not fall within the predetermined range, the control unit 60 transmits control information for liquid temperature adjustment to the liquid temperature adjusting unit 30 on the basis of the above correlation. On the basis of the control information for liquid temperature adjustment, the liquid temperature adjusting unit 30 adjusts the temperature of the immersion exposure liquid. Thus, the temperature of the immersion exposure liquid is adjusted so as to reduce the dimensional difference.

Description will be given below of the relationship between the temperature of the immersion exposure liquid and the dimensional difference observed if the immersion exposure liquid is water. Light has a wavelength of 193 nm in a vacuum, whereas water has a refractive index of 1.44 at room temperature. A change in water temperature by 1° C. changes the refractive index by about 0.0001. Consequently, when a water layer has a thickness of 1 mm, a change in water temperature by 0.5° C. changes the length of an optical path in the water layer by 50 nm (=0.5×0.0001×1 mm). The wavelength in water is 134 nm (=193 nm/1.44). Accordingly, the change in optical path length is 370 milli-wavelength (50 nm/134 nm=0.37) in terms of wavelength. Further, a phase difference of several millimeters to several tens of millimeters occurs between light perpendicularly incident on the substrate and light obliquely incident on the substrate. For example, with an exposure apparatus having a projection lens with an NA of 1.3, the phase difference between light with the largest incident angle (incident angle to the substrate=64 degrees) and perpendicular light is about 48 m$\lambda$. With respect to the dependence of the phase difference on the incident angle, terms dependent on the fourth or higher order of the incident angle are generally called aberration. The aberration is a factor that may make a difference in dimension between the isolated line and the dense line. Specifically, a change in water temperature (liquid temperature) changes the refractive index and thus the dimensional difference. With the above exemplary lens with NA=1.3, if a spherical aberration that represents a fourth-order dependent component of the incident angle is expressed using the coefficients of a Zernike polynominal, the aberration is about 4 m$\lambda$. On the basis of this aberration, although depending on illumination conditions or a resist type, a dimensional difference (OPE difference) of about 3 nm is expected to occur between a 45-nm line and space pattern and a 200-nm isolated line.

Then, a device forming substrate (semiconductor wafer on which a photoresist film has been formed) is set in the immersion exposure apparatus 10. Patterns formed on the photomask are projected on the device forming substrate via the projection lens and the immersion exposure liquid having its refractive index adjusted (its temperature adjusted) (S6). This forms a latent image in the photoresist film formed on the surface of the substrate.

The photoresist film is then developed to form photoresist patterns. The present embodiment exposes the photoresist film via the immersion exposure liquid having its refractive index (its temperature) adjusted. Consequently, the photoresist patterns are formed so that the dimensional difference between the isolated line pattern and the isolated space pattern (or dimensional difference between the isolated line pattern and the dense line pattern) falls within the predetermined range. Further, the photoresist patterns are used as a mask to etch etching target films (conductive film, insulating film, semiconductor film, and the like) on the semiconductor wafer to form desired patterns (S7).

As described above, the present embodiment acquires dimensional information (dimensional difference) on the plurality of dimension acquiring patterns (isolated line pattern and isolated space pattern or isolated line pattern and dense line pattern) to adjust the refractive index of the immersion exposure liquid on the basis of the dimensional information. The patterns formed on the photomask are projected on the substrate via the immersion exposure liquid having its refractive index thus adjusted. This makes it possible to reduce the dimensional difference to enable patterns with desired dimensions to be accurately formed. Therefore, accurate patterns can be formed in spite of variations in exposure characteristics resulting from temporal changes caused by various factors.

The present embodiment also adjusts the temperature of the immersion exposure liquid to adjust its refractive index. This enables the refractive index of the immersion exposure liquid to be simply and easily adjusted compared to the adjustment of the refractive index based on a change of the immersion exposure liquid type.

Embodiment 2

Now, a second embodiment of the present invention will be described. The basic apparatus configuration (FIGS. 1 and 2) and basic operation (FIG. 3) of the second embodiment are similar to those of the first embodiment and will not be described in detail. Differences from the first embodiment will mainly be described below.

Figure 3:
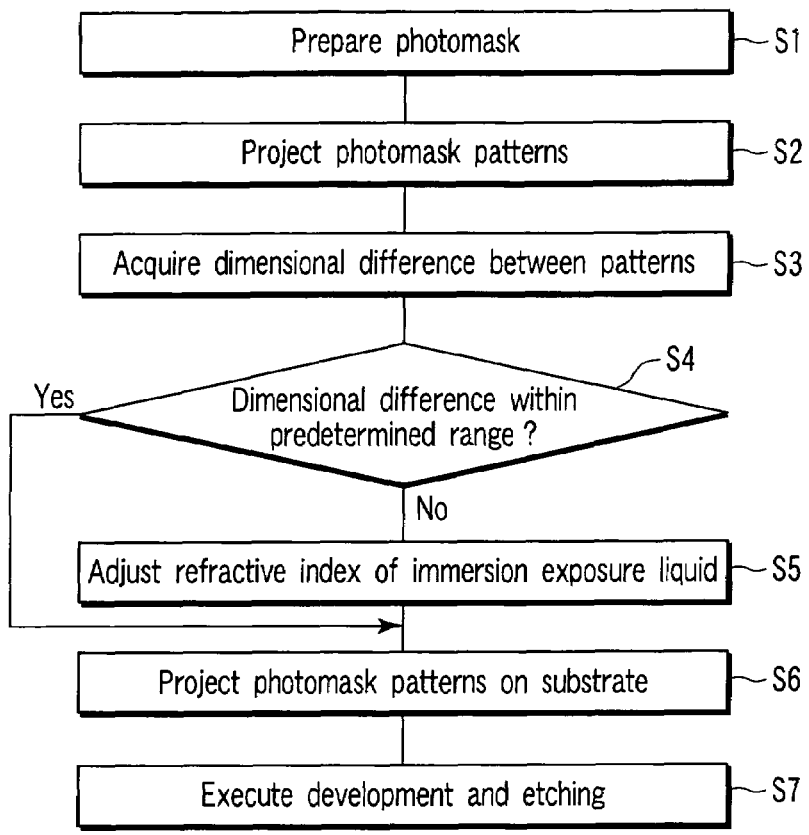
FIG. 3 is a flowchart showing a method according to the first to fourth embodiments of the present invention.

The above first embodiment adjusts the temperature of the immersion exposure liquid to adjust its refractive index in step S5 in FIG. 3. However, the present embodiment adjusts the movement speed of the immersion exposure liquid to adjust its refractive index in step 5. That is, in step S4, if the dimensional difference is determined not to fall within the predetermined range, the movement speed of the immersion exposure liquid is adjusted so as to reduce the dimensional difference in step S5. Specifically, the liquid supply unit 20 adjusts the movement speed of the immersion exposure liquid so that the dimensional difference falls within the predetermined range. For example, the movement speed of the immersion exposure liquid is adjusted by such a method as described below.

First, the correlation between the movement speed of the immersion exposure liquid and the dimensional difference (or correlation between the amount of change in the movement speed of the immersion exposure liquid and the amount of change in dimensional difference) is predetermined. The correlation is stored in the control unit 60. If the dimensional difference does not fall within the predetermined range, the control unit 60 transmits control information for movement speed adjustment to the liquid supply unit 20 on the basis of the above correlation. On the basis of the control information for movement speed adjustment, the liquid supply unit 20 adjusts the movement speed of the immersion exposure liquid. Specifically, the amount of liquid supplied by the liquid supply unit 20 per unit time is adjusted. This allows the movement speed of the immersion exposure liquid to be adjusted so as to reduce the dimensional difference.

Description will be given below of the relationship between the movement speed of the immersion exposure liquid and the dimensional difference. In the immersion exposure, as shown in FIG. 2, exposure is carried out with the immersion exposure liquid 14 interposed between the projection lens 13 and the substrate 12. Thus, the energy of exposure light raises the temperature of the immersion exposure liquid 14 interposed between the projection lens 13 and the substrate 12. Consequently, if the immersion exposure liquid 14 moves (flows) at a high speed between the projection lens 13 and the substrate 12, the temperature of the immersion exposure liquid 14 rises insignificantly. In contrast, if the immersion exposure liquid 14 moves (flows) at a low speed between the projection lens 13 and the substrate 12, the temperature of the immersion exposure liquid 14 rises significantly. As already described in the first embodiment, a change in the temperature of the immersion exposure liquid changes the refractive index of the immersion exposure liquid and thus the dimensional difference. Therefore, adjustment of the movement speed of the immersion exposure liquid 14 changes the refractive index of the immersion exposure liquid 14 flowing between the projection lens 13 and the substrate 12. This enables the dimensional difference to be adjusted.

The subsequent basic steps are similar to those of the first embodiment. That is, in step S6, patterns formed on the photomask are projected on the device forming substrate via the projection lens and the immersion exposure liquid having its refractive index adjusted (its movement speed adjusted). Further, in step S7, the photoresist film is developed and the etching target films are etched to form desired patterns.

As described above, like the first embodiment, the present embodiment adjusts the refractive index of the immersion exposure liquid, which enables the accurate formation of patterns having desired dimensions with dimensional differences reduced.

The present embodiment also adjusts the movement speed of the immersion exposure liquid to change the temperature of the immersion exposure liquid to adjust its refractive index. This eliminates a mechanism for heating and cooling the immersion exposure liquid, allowing the refractive index of the immersion exposure liquid to be simply and easily adjusted.

Embodiment 3

Now, a third embodiment of the present invention will be described. The basic apparatus configuration (FIGS. 1 and 2) and basic operation (FIG. 3) of the third embodiment are similar to those of the first embodiment and will not be described in detail. Differences from the first embodiment will mainly be described below.

The above first embodiment uses photoresist patterns actually formed on a semiconductor wafer as dimension acquiring patterns in order to acquire a dimensional difference (dimensional difference between an isolated line pattern and an isolated space pattern or between the isolated line pattern and dense line patterns) in step S3. In contrast, the present embodiment uses, as dimension acquiring patterns, patterns predicted on the basis of an optical image of patterns projected on a surface (predetermined surface) of a substrate holding stage.

Figure 6:
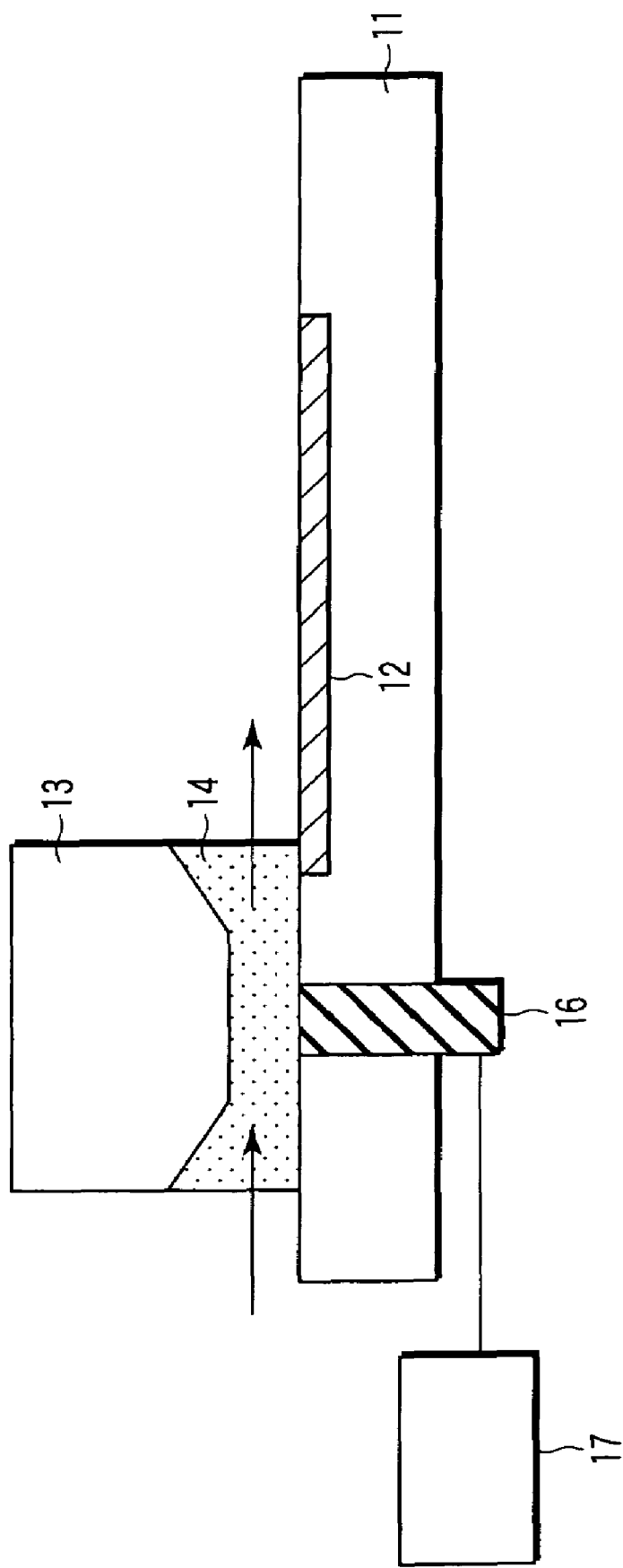
FIG. 6 is a diagram schematically showing a part of configuration of an immersion exposure apparatus according to the third embodiment of the present invention.

FIG. 6 is a diagram schematically showing a part of configuration of an immersion exposure apparatus according to the present embodiment. As shown in FIG. 6, an optical image acquiring unit 16 is provided in a part of a substrate holding stage 11. The optical image acquiring unit 16 includes, for example, CCD. To acquire a dimensional difference in step S3, patterns formed on a photomask are projected on a surface (predetermined surface) of the substrate holding stage 11 via the projection lens 13 and immersion exposure liquid 14. An optical image of the projected patterns is acquired by the optical image acquiring unit 16 and sent to an optical image analyzing unit 17. The optical image analyzing unit 17 predicts the dimensions of the photoresist patterns on the basis of the optical image. The optical image analyzing unit 17 calculates the dimensional difference (dimensional difference between an isolated line pattern and an isolated space pattern or between the isolated line pattern and dense line patterns) on the basis of predicted dimensions of the photoresist patterns.

As described above, like the first embodiment, the present embodiment adjusts the refractive index of the immersion exposure liquid, which enables the accurate formation of patterns having desired dimensions with dimensional differences reduced.

The present embodiment also uses the patterns predicted on the basis of the optical image of the projected patterns, as dimension acquiring patterns. This eliminates the need to actually form photoresist patterns as dimension acquiring patterns. Therefore, the dimension acquiring patterns can be quickly acquired.

Embodiment 4

Now, a fourth embodiment of the present invention will be described. The basic apparatus configuration (FIGS. 1 and 2) and basic operation (FIG. 3) of the fourth embodiment are similar to those of the first embodiment and will not be described in detail. Differences from the first embodiment will mainly be described below.

The optical proximity effect (OPE) generally depends on the exposure apparatus. Thus, if a photomask subjected to an optical proximity correction (OPC) appropriate for one exposure apparatus is applied to another exposure apparatus, patterns having desired dimensions cannot be formed. Accordingly, in this case, a new photomask needs to be created which is subjected to an optical proximity correction appropriate for the latter exposure apparatus. However, creation of a new photomask increases a manufacture period or cost.

In the first embodiment, if exposure characteristics are varied mostly by temporal changes in the exposure apparatus, the refractive index of the immersion exposure liquid is adjusted to form patterns of desired shapes. A change of the exposure apparatus also changes the exposure characteristics. Accordingly, a method similar to that in the first embodiment is applicable to the present embodiment.

Thus, to apply a photomask created for one exposure apparatus to another exposure apparatus, the present embodiment uses a method similar to that shown in the flowchart in FIG. 3 to adjust the refractive index of the immersion exposure liquid. Adjustment of the refractive index enables the dimensional difference to fall within the predetermined range as is the case with the first embodiment. As a result, the same photomask can be used for different exposure apparatuses.

Thus, the present embodiment enables the same photomask to be used for different exposure apparatuses. This makes it possible to inhibit an increase in manufacture period or cost. Further, each is exposure apparatus can accurately form patterns of desired dimensions with dimensional differences reduced, as in the case of the first embodiment.

The configurations and methods described in the first to fourth embodiments can be appropriately combined together for implementation.

The first to fourth embodiments use water as an immersion exposure liquid. However, a liquid other than water may be used. For example, the immersion exposure liquid may be composed of a liquid (for example, water) serving as a base and to which an additive (for example, ethanol) is added. In this case, the concentration of the additive may be adjusted in order to adjust the refractive index of the immersion exposure liquid.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device using immersion exposure in which exposure is carried out with an immersion exposure liquid interposed between a projection lens and a substrate, the method comprising:
preparing a photomask on which a plurality of mask patterns are formed;
projecting the mask patterns formed on the photomask, on a predetermined surface via the projection lens and the immersion exposure liquid;
acquiring dimensional information on the patterns projected on the predetermined surface;
adjusting a refractive index of the immersion exposure liquid on the basis of the dimensional information; and
projecting mask patterns formed on a photomask, on a substrate via the projection lens and the immersion exposure liquid with the refractive index adjusted.

2. The method according to claim 1, wherein the dimensional information includes a dimensional difference between the patterns projected on the predetermined surface.

3. The method according to claim 2, wherein the refractive index of the immersion exposure liquid is adjusted to reduce the dimensional difference.

4. The method according to claim 1, wherein the refractive index of the immersion exposure liquid is adjusted by adjusting a temperature of the immersion exposure liquid.

5. The method according to claim 4, wherein the refractive index of the immersion exposure liquid is adjusted on the basis of a predetermined correlation between the dimensional information and temperature information on the immersion exposure liquid.

6. The method according to claim 1, wherein the refractive index of the immersion exposure liquid is adjusted by adjusting a movement speed of the immersion exposure liquid.

7. The method according to claim 6, wherein the refractive index of the immersion exposure liquid is adjusted on the basis of a predetermined correlation between the dimensional information and movement speed information on the immersion exposure liquid.

8. The method according to claim 6, wherein a temperature of the immersion exposure liquid is adjusted by adjusting the movement speed of the immersion exposure liquid.

9. The method according to claim 1, wherein the predetermined surface is a surface of a substrate having a photoresist film.

10. The method according to claim 9, wherein the dimensional information includes information on photoresist patterns actually formed on the basis of patterns projected on the surface of the substrate.

11. The method according to claim 1, wherein the predetermined surface is a surface of a substrate holding stage.

12. The method according to claim 11, wherein the dimensional information includes information on predicted patterns based on an optical image of patterns projected on the surface of the substrate holding stage.

13. The method according to claim 1, wherein the patterns formed on the photomask include an isolated line pattern and an isolated space pattern.

14. The method according to claim 1, wherein the patterns formed on the photomask include an isolated line pattern and dense line patterns.

15. The method according to claim 1, wherein the immersion exposure liquid includes water.

* * * * *